(12) United States Patent
Lee et al.

(10) Patent No.: US 12,514,035 B2
(45) Date of Patent: Dec. 30, 2025

(54) DISPLAY DEVICE AND METHOD OF MANUFACTURING THE SAME

(71) Applicant: Samsung Display Co., LTD., Yongin-si (KR)

(72) Inventors: Jong Chan Lee, Suwon-si (KR); Jin Taek Kim, Yongin-si (KR); Hyun Kim, Seoul (KR); Jeong Su Park, Asan-si (KR); Woong Hee Jeong, Seoul (KR); Jung Eun Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 590 days.

(21) Appl. No.: 17/979,071

(22) Filed: Nov. 2, 2022

(65) Prior Publication Data

US 2023/0317882 A1    Oct. 5, 2023

(30) Foreign Application Priority Data

Mar. 30, 2022    (KR) .......................... 10-2022-0039421

(51) Int. Cl.
*H10H 20/831*    (2025.01)
*H01L 25/075*    (2006.01)
*H10H 20/01*    (2025.01)
*H10H 20/832*    (2025.01)
*H10H 20/857*    (2025.01)

(52) U.S. Cl.
CPC ..... *H10H 20/8312* (2025.01); *H01L 25/0753* (2013.01); *H10H 20/01* (2025.01); *H10H 20/832* (2025.01); *H10H 20/857* (2025.01); *H10H 20/032* (2025.01); *H10H 20/0364* (2025.01)

(58) Field of Classification Search
CPC .. H10H 20/8312; H10H 20/01; H10H 20/832; H10H 20/857; H10H 20/032; H10H 20/0364; H01L 25/0753
See application file for complete search history.

(56) References Cited

U.S. PATENT DOCUMENTS

2014/0209963 A1*   7/2014   Lee ................... H10H 20/8316
                                                          257/99

FOREIGN PATENT DOCUMENTS

| KR | 10-1376755 | 3/2014 |
| KR | 10-2020-0010704 | 1/2020 |
| KR | 10-2021-0059110 | 5/2021 |

* cited by examiner

*Primary Examiner* — Samuel A Gebremariam
(74) *Attorney, Agent, or Firm* — Womble Bond Dickinson (US) LLP

(57) ABSTRACT

A display device includes, first and second electrodes on a substrate, a buffer layer covering the first and second electrodes, a light emitting element between the first and second electrodes a first contact electrode on the first electrode electrically contacting an end of the light emitting element, and a second contact electrode on the second electrode electrically contacting another end of the light emitting element, and an active layer on the buffer layer, and a first connection electrode electrically contacting at least one side of the active material layer the first and second contact electrodes, and the active material layer are on a same layer, and a thickness of the first electrode and a thickness of the second electrode is greater than about 800 nm.

20 Claims, 13 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0039421 under 35 U.S.C. § 119 filed on Mar. 30, 2022 in the Korean Intellectual Property Office, the entire contents of which are incorporated herein by reference.

BACKGROUND

1. Technical Field

The disclosure relates to a display device and a method of manufacturing the same.

2. Description of the Related Art

With the advancement of multimedia, the importance of a display device has been increased. Accordingly, various types of display devices such as an organic light emitting display (OLED) device and a liquid crystal display (LCD) device have been used.

There is a self-light emitting display device that may include a light emitting element as a device for displaying an image of a display device. Examples of the self-light emitting display device include an organic light emitting display device that uses an organic material as a light emitting material and an organic light emitting display device that uses an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device comprising a light emitting element, and a transistor having an oxide semiconductor as an active material layer.

Another object of the disclosure is to provide a display device in which a process of forming a transistor on a light emitting element is performed to simplify a manufacturing process.

The objects of the disclosure are not limited to those mentioned above and additional objects of the disclosure will be clearly understood by those skilled in the art from the following description of the disclosure.

According to an embodiment, a display device may include a light emission area and a non-light emission area; a first electrode and a second electrode, spaced apart from each other on a substrate in the light emission area; a buffer layer disposed in the light emission area and the non-light emission area, covering the first electrode and the second electrode; a light emitting element disposed between the first electrode and the second electrode; a first contact electrode disposed on the first electrode electrically contacting an end of the light emitting element, and a second contact electrode disposed on the second electrode electrically contacting an end of the light emitting element; and an active layer disposed on the buffer layer, a first insulating layer disposed on the active material layer, a gate electrode disposed on the first insulating layer and overlapping the active material layer in a thickness direction, and a first connection electrode electrically contacting at least one side of the active material layer, in the non-light emission area, wherein the first contact electrode, the second contact electrode, and the active material layer are disposed on a same layer, and each of a thickness of the first electrode and a thickness of the second electrode is greater than about 800 nm.

The active material layer may be electrically connected to the first contact electrode.

Each of the active material layer, the first contact electrode and the second contact electrode may include an oxide semiconductor.

The active material layer may include a first conductorization area, a second conductorization area, and a channel area disposed between the first conductorization area and the second conductorization area, and the first contact electrode, the second contact electrode, and the first conductorization area may include a same material.

The light emitting element may not overlap at least the active material layer in the thickness direction.

The display device may further include a light shielding layer overlapping the active material layer and disposed between the buffer layer and the substrate.

The light shielding layer, the first electrode and the second electrode may be disposed on a same layer.

The light shielding layer and each of the first electrode and the second electrode may include a same material.

Each of the first electrode and the second electrode may directly contact the substrate.

Each of an entire lower surface of the first electrode and an entire lower surface of the second electrode may directly contact the substrate.

A second insulating layer may be disposed on the first insulating layer, the first contact electrode and the second contact electrode in the light emission area.

The second insulating layer may partially expose an upper surface of the first contact electrode and an upper surface of the second contact electrode.

An inner end of the first insulating layer on the first contact electrode may be aligned with an inner end of the first contact electrode in the thickness direction in the light emission area, and an inner end of the first insulating layer on the second contact electrode may be aligned with an inner end of the second contact electrode in the thickness direction in the light emission area.

The first connection electrode and the gate electrode may include a same material, and the first connection electrode may directly contact the exposed upper surface of the first contact electrode.

The light emitting element may not overlap each of the first electrode and the second electrode in the thickness direction.

Each of the first electrode and the second electrode may have a uniform thickness.

According to an embodiment, a method of manufacturing a display device may include disposing a first electrode and a second electrode, spaced apart from each other in a light emission area on a substrate, the display device including the light emission area and a non-light emission area; disposing a buffer layer covering the first electrode and the second electrode on the substrate; disposing a light emitting element between the first electrode and the second electrode; disposing a first contact electrode electrically contacting an end of the light emitting element on the first electrode, and a second contact electrode electrically contacting another end of the light emitting element on the second electrode, in the light emission area and disposing an active material layer in the non-light emission area; disposing a first insulating layer on the buffer layer, the first contact electrode and the second contact electrode in the light emission area and on the active material layer in the non-light emission area; and disposing a gate electrode overlapping in a thickness direction the active material layer and a first connection electrode electrically contacting at least one side of the active material layer, the first contact electrode, the second contact electrode, and the active material layer may be formed on a same layer, and each of a thickness of the first electrode and a thickness of the second electrode is greater than about 800 nm.

The active material layer may be electrically connected to the first contact electrode, and each of the active material layer, the first contact electrode and the second contact electrode may include an oxide semiconductor.

The active material layer may include a first conductorization area, a second conductorization area, and a channel area disposed between the first conductorization area and the second conductorization area, and each of the first contact electrode, the second contact electrode, and the first conductorization area may include a same material.

The disposing of the first electrode and the second electrode may include disposing a light shielding layer disposed between the buffer layer and the substrate, and the active material layer may overlap the light shielding layer in the thickness direction.

Details of other embodiments are included in the detailed description and drawings.

A display device according to one embodiment may have a front light emitting structure or a rear light emitting structure based on a substrate, in which each pixel may include a light emission area in which a light emitting element is disposed and a non-light emission area in which circuit elements are disposed.

Also, an active material layer of a transistor of the circuit elements may be disposed above the light emitting element. The light emitting element and a contact electrode that is in contact with an electrode may be substantially disposed on the same layer as the active material layer of the transistor, and may be formed by the same process during a manufacturing process of the display device. Therefore, in the display device according to one embodiment, the number of manufacturing processes may be reduced.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
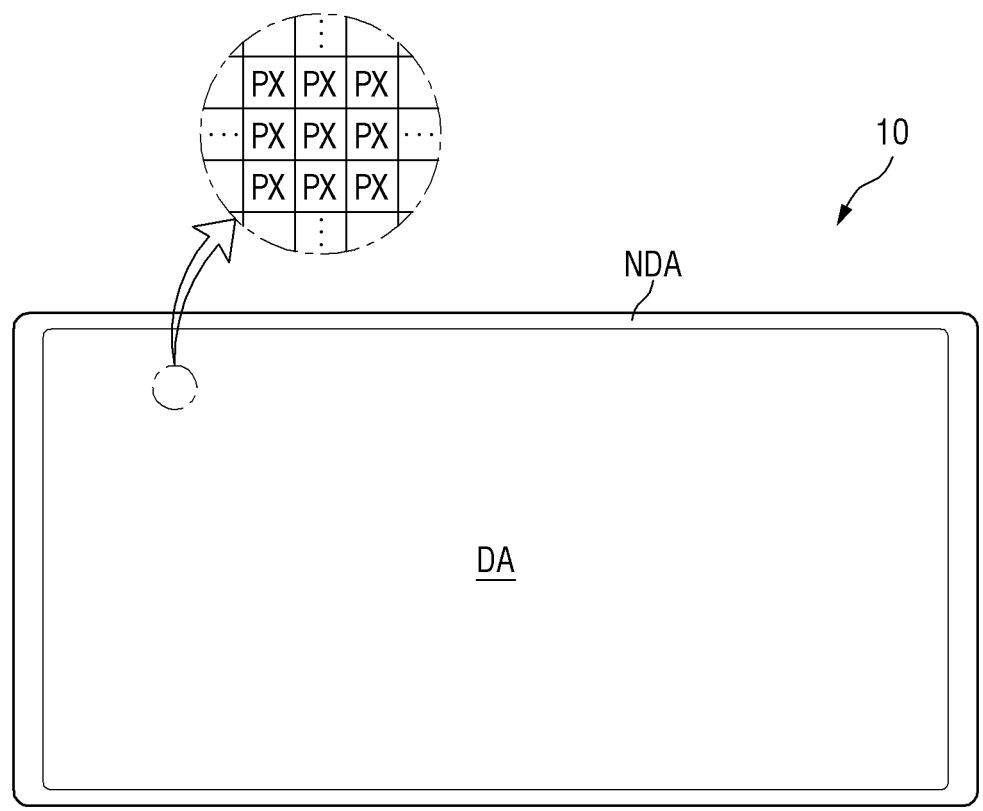
FIG. 1 is a schematic plan view illustrating a display device according to one embodiment.
Figure 1:
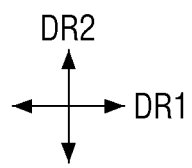

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view illustrating a display device according to one embodiment.

Referring to FIG. 1, a display device 10 displays a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like, which provide a display screen, may be included in the display device 10.

The display device 10 may include a display panel for providing a display screen. Examples of the display panel include an LED panel, an organic light emitting display panel, a quantum dot light emitting display panel, a plasma display panel and a field emission display panel. Hereinafter, the LED display panel is applied as an example of the display panel, but the example of the display panel is not limited thereto. Another display panel may be used as applicable thereto.

Various modifications may be made in a shape of the display device 10. For example, the display device 10 may have a rectangular shape that is long in a horizontal direction, a rectangular shape that is long in a vertical direction, a square shape, a square shape with rounded corners (vertexes), other polygonal shape, a circular shape, etc., within the spirit and the scope of the disclosure. A shape of a display area DA of the display device 10 may be also similar to the overall shape of the display device 10. A display device 10 and a display area DA, each of which has a rectangular shape that is longer in a horizontal direction, are illustrated in FIG. 1.

The display device 10 may include a display area DA and a non-display area NDA. The display area DA is an area in which a screen may be displayed, and the non-display area NDA is an area in which a screen is not displayed. The display area DA may be referred to as an active area, and the non-display area NDA may be referred to as a non-active area.

The display area DA may generally occupy the center of the display device 10. The display area DA may include pixels PX. The pixels PX may be disposed in a matrix direction. A shape of each pixel PX may be a rectangular or square shape on a plane, but is not limited thereto. The shape of each pixel PX may be a rhombus shape in which each side is inclined with respect to a first direction DR1. The respective pixels PX may be disposed in a stripe type or an island type. Also, each of the pixels PX may include one or more light emitting elements 300 for emitting light of a given wavelength band to display a given color.

Although not shown, the pixels PX may include a first pixel for emitting light of a first color, a second pixel for emitting light of a second color, and a third pixel for emitting light of a third color. In an embodiment, the first color, the second color and the third color may be different from one another, and the first color may be blue, the second color may be green, and the third color may be red, but the disclosure is not limited thereto, and the pixels PX may emit light of a same color.

Each of the pixels may include a driving transistor, at least one switching transistor, a light emitting element, and a capacitor. Since the switching transistor is turned on in case that a scan signal is applied from a scan line SCL, a data voltage of a data line DTL may be applied to a gate electrode of the driving transistor. The driving transistor may emit light by supplying a driving current to the light emitting element in accordance with the data voltage applied to the gate electrode. The driving transistor and the at least one switching transistor may be thin film transistors. The light emitting element may emit light in accordance with the driving current of the driving transistor. The light emitting element may be an inorganic light emitting diode that may include a semiconductor layer and an active layer. The capacitor may serve to uniformly maintain the data voltage applied to the gate electrode of the driving transistor.

Figure 2:
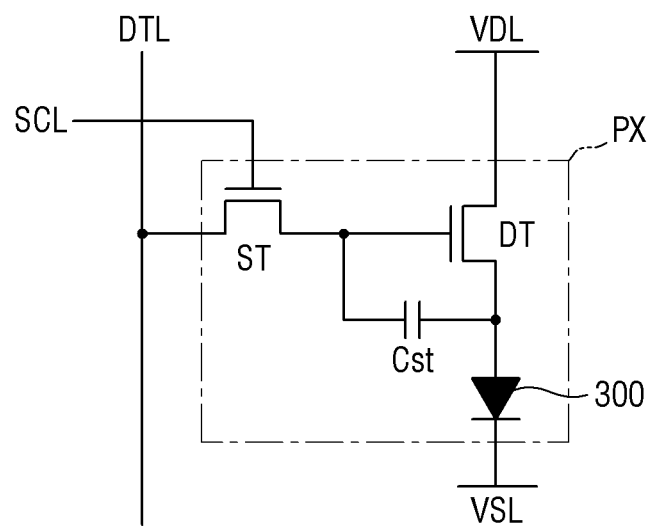
FIG. 2 is a schematic diagram of an equivalent circuit of a pixel of FIG. 1.

FIG. 2 is a schematic diagram of an equivalent circuit of a pixel of FIG. 1.

Referring to FIG. 2, the pixel PX may include a driving transistor DT, a switching transistor ST, a light emitting element 300, and a capacitor Cst. FIG. 2 illustrates a 2Transistor-1Capacitor (2T1C) structure in which each pixel PX may include one driving transistor DT and one switching transistor ST and one capacitor Cst, but the disclosure is not limited thereto. Each pixel PX may include a larger number of transistors and capacitors.

Each of the driving transistor DT and the switching transistor ST may include one electrode, the other electrode, and a gate electrode. One of the one electrode and the other electrode may be a source electrode, and the other may be a drain electrode.

Each of the driving transistor DT and the switching transistor ST may be formed of a thin film transistor. In FIG. 2, each of the driving transistor DT and the switching transistor ST is formed of an N-type Metal Oxide Semiconductor Field Effect Transistor (MOSFET), but is not limited thereto. Each of the driving transistor DT and the switching transistor ST may be formed of a P-type MOSFET. Positions of a source electrode and a drain electrode of each of the driving transistor DT and the switching transistor ST may be changed. Hereinafter, the case that each of the driving transistor DT and the switching transistor ST is an N-type MOSFET will be described.

The driving transistor DT may emit light by supplying a driving current to the light emitting element 300 in accordance with the data voltage applied to the gate electrode. For example, the driving transistor DT may be a driving transistor. The gate electrode of the driving transistor DT may be connected to the source electrode of the switching transistor ST, its source electrode may be connected to a first electrode of the light emitting element 300, and its drain electrode may be connected to a first power line VDL to which a first power voltage is applied.

The switching transistor ST is turned on in case that the scan signal is applied from the scan line SCL, so that the data voltage of the data line DTL may be applied to the gate electrode of the driving transistor DT. For example, the switching transistor ST may be a switching transistor. The gate electrode of the switching transistor ST may be connected to the scan line SCL, its source electrode may be connected to the gate electrode of the driving transistor DT, and its drain electrode may be connected to the data line DTL.

The capacitor Cst may be connected between the gate electrode and the source electrode of the driving transistor DT. Therefore, the capacitor Cst may serve to uniformly maintain the data voltage applied to the gate electrode of the driving transistor DT.

The light emitting element 300 may emit light in accordance with the driving current of the driving transistor DT. The light emitting element 300 is electrically connected to the first electrode and the second electrode. The first electrode may be connected to the source electrode of the driving transistor DT, and the second electrode may be connected to a second power line VSL to which a second power voltage lower than the first power voltage is applied.

Hereinafter, a structure of the display device 10 will be described in detail with reference to other drawings.

Figure 3:
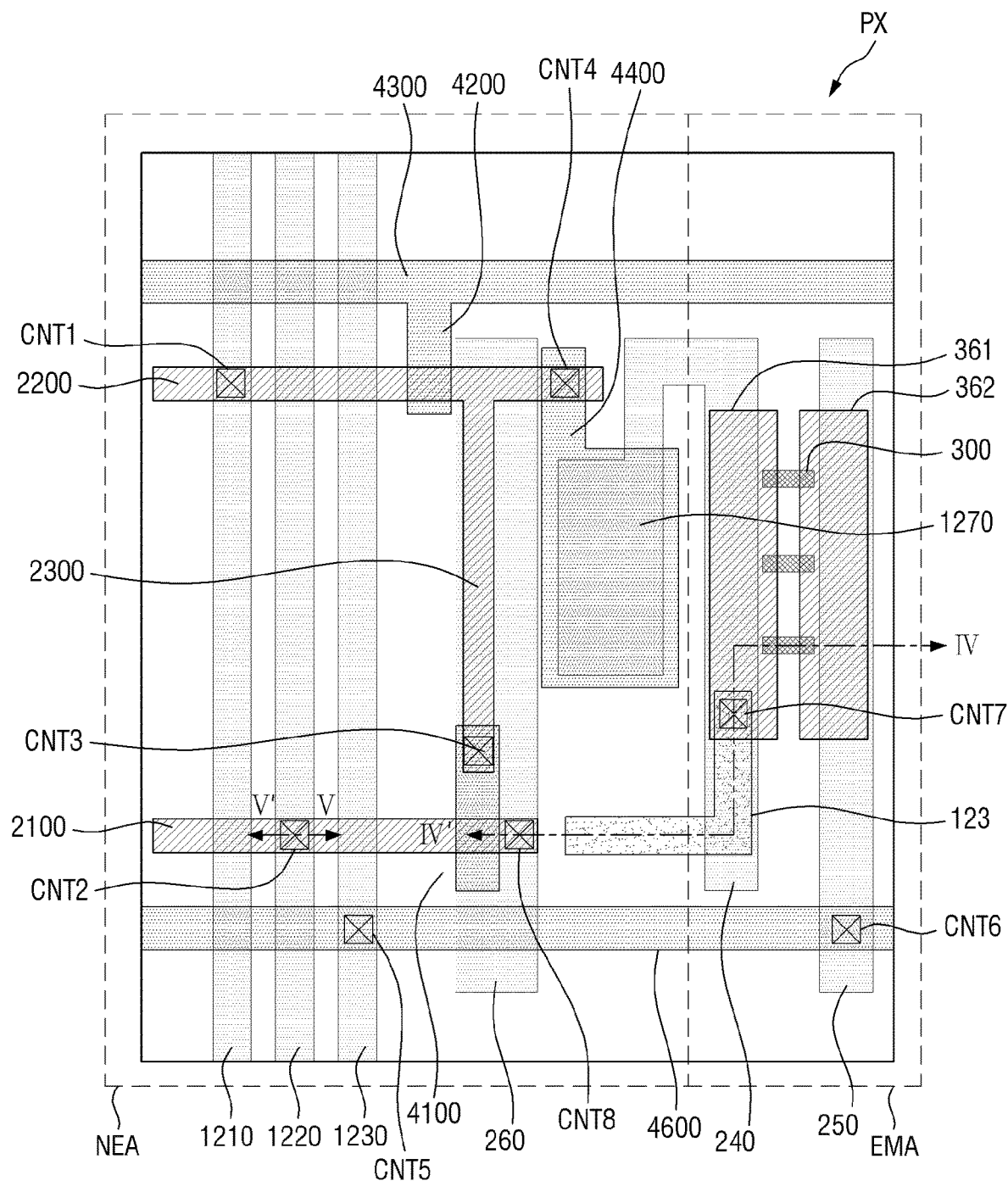
FIG. 3 is a schematic plan view illustrating one pixel of a display device according to one embodiment.

FIG. 3 is a schematic plan view illustrating one pixel of a display device according to one embodiment.

Referring to FIG. 3, each pixel PX of the display device 10 may include a light emission area EMA and a non-light emission area NEA. The light emission area EMA may be defined as an area in which the light emitting element 300 included in the display device 10 is disposed to emit light of a given wavelength band. The light emitting element 300 may include an active layer 330, and the active layer 330 may emit light of a given wavelength band without directionality. For example, the light emitted from the active layer 330 of the light emitting element 300 may be emitted in a lateral direction of the light emitting element 300, including both end directions of the light emitting element 300. The light emission area EMA of each pixel PX may include an area in which light emitted from the light emitting element 300 is emitted to an area adjacent to the light emitting element 300, in addition to the area in which the light emitting element 300 is disposed. The light emission area EMA may further include an area where the light emitted from the light emitting element 300 is emitted by being reflected or refracted by another member. The light emitting elements 300 may be disposed in each pixel PX, and may include an area in which the light emitting elements 300 are disposed, and an area adjacent to the area in which the light emitting elements 300 are disposed, to form the light emission area EMA.

The non-light emission area NEA is an area other than the light emission area EMA in each pixel PX. The non-light emission area may be an area in which the light emitting element 300 is not disposed and light emitted from the light emitting element 300 does not reach there so that the light is not emitted. Also, as shown, lines and circuit elements may be disposed in the non-light emission area EMA. The driving transistor DT, the switching transistor ST and capacitors Cst of each pixel PX and lines may be disposed in the non-light emission area NEA.

Since the display device 10 according to one embodiment may include a light emitting area EMA in which the light emitting elements 300 are disposed and a non-light emitting area NEA in which the light emitting elements 300 are not disposed, the light emitting element 300 for emitting light displayed in each pixel PX and the circuit elements for driving the light emitting element 300 may be disposed in their respective areas distinguished from each other. For example, in the display device 10 according to one embodiment, the light emitting element 300 for emitting light and the circuit elements for driving the light emitting element 300 may be disposed in their respective areas different from each other, for example, the light emission area EMA and the non-light emission area NEA, respectively, and may not overlap each other in a thickness direction. The light emitting element 300 may not overlap at least a first active material layer 126 of the driving transistor DT in the thickness direction, and therefore, the display device 10 may emit light to an upper surface or a rear surface of the area in which the light emitting elements 300 are disposed.

In detail, the display device 10 may include a substrate 110, and a semiconductor layer, conductive layers and light emitting elements 300, which are disposed on the substrate 110. Also, insulating layers may be disposed between the semiconductor layer and the conductive layer. The light emission area EMA and the non-light emission area NEA may be defined on the substrate 110, and the semiconductor layer, the conductive layer and the light emitting elements 300 may be disposed in the light emission area EMA and the non-light emission area NEA, respectively.

The first conductive layer may include a data line 1210, a first voltage line 1220, a second voltage line 1230, a first electrode 240, a second electrode 250, a light shielding layer 260, and a capacitor first electrode 1270. The data line 1210, the first voltage line 1220, the second voltage line 1230, the light shielding layer 260, and the capacitor first electrode 1270 are disposed in the non-light emission area NEA, and the first electrode 240 and the second electrode 250 are disposed in the light emission area EMA. The first electrode 240 and the second electrode 250 may be electrically connected to the light emitting element 300.

The data line 1210 may transfer a data signal to each pixel PX. The data line 1210 may be disposed on one side or a side in the first direction DR1, for example, on a left side based on the center of the pixel PX in the non-light emission area NEA, and may be extended in a second direction DR2. The data line 1210 may be extended to another pixel PX adjacent to one pixel PX in the second direction DR2.

The first voltage line 1220 may transfer a first power voltage to each pixel PX. For example, the first voltage line 1220 may be the first power line VDL of FIG. 2. The first voltage line 1220 may be disposed on one side or a side of the data line 1210, for example, on a right side of the data line 1210 in the non-light emission area NEA and extended in the second direction DR2. The first voltage line 1220 may be extended to another pixel PX adjacent to one pixel PX in the second direction DR2. The first voltage line 1220 may be in contact with a first semiconductor area 2100, which will described later, through a second contact hole CNT2 to transfer the first power voltage to the driving transistor DT of each pixel PX.

The second voltage line 1230 may transfer a second power voltage to each pixel PX. For example, the second voltage line 1230 may be the second power line VSL of FIG. 2. The second voltage line 1230 may be disposed on one side or a side of the first voltage line 1230, for example, on a right side of the first voltage line 1230 in the non-light emission area NEA and extended in the second direction DR2. The second voltage line 1230 may be extended to another pixel PX adjacent to one pixel PX in the second direction DR2. The second voltage line 1230 may be in contact with a conductive line 4600, which will be described later, through a fifth contact hole CNT5 to transfer the second power voltage to the second electrode 250 of each pixel PX.

The light shielding layer 260 may be disposed on one side or a side of the second voltage line 1230, for example, on a right side of the second voltage line 1230, and may be extended in the second direction DR2. Although not shown, the light shielding layer 260 may be electrically connected to a source electrode (not shown) of the driving transistor DT. The light shielding layer 260 may be disposed to overlap the first active material layer 126 of the driving transistor DT to prevent light from being incident on the first active material layer 126. For example, the light shielding layer 260 may be formed of an opaque metal material that shields transmission of light.

The first electrode 240 may transfer the first power voltage to the light emitting element 300. The first electrode 240 may be electrically connected to one end or an end of the light emitting element 300 and the driving transistor DT, and may transfer the first power voltage transferred through the first voltage line 1220 to the light emitting element 300. The first electrode 240 may be disposed on one side or a side of the light emission area EMA, for example, a left side adjacent to the non-light emission area NEA, and may be extended in the second direction DR2. Unlike the first voltage line 1220, the first electrode 240 may not be extended to another pixel PX adjacent thereto in the second direction DR2, but may be disposed for each pixel PX.

The second electrode 250 may transfer the second power voltage to the light emitting element 300. The second electrode 250 may be electrically connected to the other end of the light emitting element 300 and the conductive line 4600, and may transfer the second power voltage transferred through the second voltage line 1230 to the light emitting element 300. The second electrode 250 may be disposed on the other side of the light emission area EMA, for example, on a right side spaced apart from the non-light emission area NEA, and may be extended in the second direction DR2. For example, the second electrode 250 may be spaced apart from the first electrode 240 to face each other. The light emitting elements 300 may be disposed in a space between the first electrode 240 and the second electrode 250. Unlike the first voltage line 1220, the second electrode 250 may not be extended to another pixel PX adjacent thereto in the second direction DR2, and may be disposed for each pixel PX.

The electrodes 240 and 250 may be electrically connected to the light emitting element 300, and may be applied with a voltage so that the light emitting element 300 emits light of a given wavelength band. At least a portion of each of the electrodes 240 and 250 may be utilized to form an electric field in a subpixel, thereby aligning the light emitting element 300.

The electrodes 240 and 250 may include a first electrode 240 and a second electrode 250. In an embodiment, the first electrode 240 may be a pixel electrode separated per each pixel, and the second electrode 250 may be a common electrode commonly connected along each pixel. One of the first electrode 240 and the second electrode 250 may be an anode electrode of the light emitting element 300, and the other thereof may be a cathode electrode of the light emitting element 300, but the disclosure is not limited thereto, and vice versa.

The capacitor first electrode 1270 may be connected to the first electrode 240, and may be disposed between the first electrode 240 and the light shielding layer 260 in the non-light emission area NEA. The capacitor first electrode 1270 may be in contact with a second semiconductor area 2200, which will be described later, through a fourth contact hole CNT4, and may overlap a capacitor second electrode 4400 with the insulating layer interposed therebetween. Therefore, the capacitor first electrode 1270 and the capacitor second electrode 4400 may constitute the capacitor Cst of FIG. 2.

The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single layer or a multi-layer. For example, the first conductive layer may be formed of a stacked structure such as Ti/Al/Ti, Mo/Al/Mo, Mo/AlGe/Mo, Ti/Cu, etc., within the spirit and the scope of the disclosure.

Each of the electrodes 240 and 250 may include a transparent conductive material. For example, each of the electrodes 240 and 250 may include, but is not limited to, a material such as indium tin oxide (ITO), indium zinc oxide (IZO) and indium tin-zinc oxide (ITZO). In an embodiment, each of the electrodes 240 and 250 may include a conductive material of high reflectance. For example, each of the electrodes 240 and 250 may include a metal such as silver (Ag), copper (Cu), aluminum (Al) or titanium (Ti). The light incident on each of the electrodes 240 and 250 may be reflected to be emitted in an upper direction of each subpixel. In an embodiment, each of the electrodes 240 and 250 may have a structure in which copper (Cu) and titanium (Ti) may be stacked each other.

The electrodes 240 and 250 may have a structure in which at least one transparent conductive material and at least one metal layer having high reflectance may be stacked each other, or may be formed as a single layer including them. In an embodiment, each of the electrodes 240 and 250 may have a stacked structure of ITO/silver (Ag)/ITO/IZO, or may be an alloy that may include aluminum (Al), nickel (Ni), lanthanum (La), and the like, but is not limited thereto.

A buffer layer 510 is disposed on the first conductive layer. The buffer layer 510 may be disposed entirely on the first conductive layer and the substrate 110 to cover them, and may be disposed to expose a portion of the first electrode 240 and the second electrode 250. The buffer layer 510 will be described later in detail.

The light emitting element 300 may be disposed between the first electrode 240 and the second electrode 250 in the light emission area EMA. One end or an end of the light emitting element 300 may be electrically connected to the first electrode 240, and the other end may be electrically connected to the second electrode 250. The light emitting element 300 may be electrically connected to the first electrode 240 and the second electrode 250 through contact electrodes 361 and 362 that will be described later.

The light emitting elements 300 may be spaced apart from each other and aligned to be substantially parallel with each other. There is no special limitation in the spaced interval between the light emitting elements 300. As the case may be, the light emitting elements 300 may be disposed to be adjacent to each other in groups, and another of the light emitting elements 300 may be spaced apart from each other by a distance in groups and aligned in one direction or a direction with a non-uniform density. Also, in an embodiment, the light emitting element 300 has a shape extended in one direction or a direction, and the direction in which each of the electrodes 240 and 250 is extended and the direction in which the light emitting element 300 is extended may be substantially perpendicular to each other, but are not limited thereto. The light emitting element 300 may be obliquely disposed without being perpendicular to the direction in which each of the electrodes 240 and 250 is extended.

A semiconductor layer and contact electrodes 361 and 362 are disposed on the light emitting element 300 and the buffer layer 510. The semiconductor layer may include a first semiconductor area 2100, a second semiconductor area 2200, and a third semiconductor area 2300, which are disposed in a non-light emission area NEA, and the contact electrodes 361 and 362 include a first contact electrode 361 disposed on the first electrode 240 and a second contact electrode 362 disposed on the second electrode 250. The first semiconductor area 2100, the second semiconductor area 2200, and the third semiconductor area 2300 may constitute an active material layer of the switching transistor ST and the driving transistor DT of each pixel PX.

The first semiconductor area 2100 may have a shape extended in the first direction DR1. As shown, the first semiconductor area 2100 may be extended from a lower side in the first direction DR1 based on the center of the pixel PX. The first semiconductor area 2100 may overlap at least the first voltage line 1220 and the light shielding layer 260. A portion of the first semiconductor area 2100 may be electrically connected to the first voltage line 1220 in an area overlapping the first voltage line 1220 through the second contact hole CNT2 that exposes the first voltage line 1220 by passing through the buffer layer 510.

The second semiconductor area 2200 may be spaced apart from the first semiconductor area 2100, and have a shape extended in the first direction DR1. As shown, the second semiconductor area 2200 may be extended from an upper side in the first direction DR1 based on the center of the pixel PX. The second semiconductor area 2200 may overlap at least the data line 1210. A portion of the second semiconductor area 2200 may be electrically connected to the data line 1210 in an area overlapping the data line 1210 through a first contact hole CNT1 that exposes the data line 1210 by passing through the buffer layer 510. Also, like the first semiconductor area 2100, the second semiconductor area 2200 may partially overlap the light shielding layer 260.

The third semiconductor area 2300 may be connected to the second semiconductor area 2200, and may be diverged toward the first semiconductor area 2100 and extended in the second direction DR2. The third semiconductor area 2300 may be extended in the second direction DR2 at a position adjacent to the center of the pixel PX and diverged to be spaced apart from the first semiconductor area 2100. The third semiconductor area 2300 may be electrically connected to a first gate electrode of the driving transistor DT, which will be described later.

The contact electrodes 361 and 362 may have a shape in which at least a portion is extended in one direction or a direction. The contact electrodes 361 and 362 may be in contact with the light emitting element 300 and the electrodes 240 and 250, respectively, and the light emitting elements 300 may receive electrical signals from the first electrode 240 and the second electrode 250 through the contact electrodes 361 and 362.

The contact electrodes 361 and 362 may include a first contact electrode 361 and a second contact electrode 362. The first contact electrode 361 and the second contact electrode 362 may be disposed on the first electrode 240 and the second electrode 250, respectively.

The first contact electrode 361 may be disposed on the first electrode 240 and extended in the second direction DR2, and may be in contact with one end or an end of the light emitting element 300. The second contact electrode 362 may be spaced apart from the first contact electrode 361 in the first direction DR1, may be disposed on the second electrode 250 and extended in the second direction DR2, and may be in contact with the other end of the light emitting element 300. The first contact electrode 361 and the second contact electrode 362 may be in contact with the first electrode 240 and the second electrode 250, which are exposed as the buffer layer 510 is not disposed. The light emitting element 300 may be electrically connected to the first electrode 240 and the second electrode 250 through the first contact electrode 361 and the second contact electrode 362.

As described above, the first semiconductor area 2100 or the second semiconductor area 2200, for example, the active material layers of the driving transistor DT and the switching transistor ST may include a polycrystalline silicon or oxide semiconductor. The contact electrodes 361 and 362 may also include an oxide semiconductor having conductivity in some cases. The contact electrodes 361 and 362 and the first active material layer (126 of FIG. 4) of the driving transistor DT may be disposed in substantially the same layer, and in an embodiment, the contact electrodes 361 and 362 and the first active material layer 126 may include a same material or a similar material. In the display device 10 according to one embodiment, the driving transistor DT of each pixel PX may be disposed above the light emitting element 300, and the contact electrodes 361 and 362, which are in contact with the light emitting element 300, and the first active material layer 126 of the driving transistor DT may be formed by a same process. Therefore, the number of manufacturing processes of the display device 10 may be reduced, and a detailed description thereof will be made later with reference to other drawings.

A first insulating layer 520 (or gate insulating layer) is disposed on the contact electrodes 361 and 362 and the active material layer. The first insulating layer 520 may be disposed entirely on the contact electrodes 361 and 362 to cover them, and contact holes CNT7, CNT8 and CNT9 may be formed in the first insulating layer 520 to expose a portion of the contact electrodes 361 and 362 or the first active material layer 126 by passing through the insulating layer 520, and a detailed description thereof will be made later.

A second conductive layer is disposed on the first insulating layer 520 (or gate insulating layer). The second conductive layer may include a first gate electrode 4100, a second gate electrode 4200, a scan signal line 4300, a storage capacitor second electrode 4400, a conductive line 4600, and a connection electrode 123 (see 125 in FIG. 4), which are disposed in the non-light emission area NEA. The first gate electrode 4100, the second gate electrode 4200, and the storage capacitor second electrode 4400 may be disposed in the non-light emission area NEA, and the scan signal line 4300 and the conductive line 4600 and the connection electrodes 123 and 125 may be disposed in the non-light emission area NEA and/or the light emission area EMA.

The first gate electrode 4100 is disposed in the non-light emission area NEA to overlap the first semiconductor area 2100, the third semiconductor area 2300 and the light shielding layer 260. The first gate electrode 4100 may constitute the gate electrode of the driving transistor DT in an area overlapping the first semiconductor area 2100. The first gate electrode 4100 may be in contact with the third semiconductor area 2300 in the area overlapping the third semiconductor area 2300 through a third contact hole CNT3, and the gate electrode of the driving transistor DT may be connected to one electrode of the switching transistor ST.

The scan signal line 4300 may transfer the scan signal to the switching transistor ST of each pixel PX. The scan signal line 4300 may be extended in the first direction DR1, and the second gate electrode 4200 may be extended in the second direction DR2 by being diverged from the scan signal line 4300. The scan signal line 4300 is extended from the upper side of the pixel PX in the first direction DR1. The scan signal line 4300 may be extended to another pixel PX adjacent to one pixel PX in the first direction DR1.

The second gate electrode 4200 may be diverged from a portion of the scan signal line 4300 in the second direction DR2. The second gate electrode 4200 may be disposed to overlap a portion of the second semiconductor area 2200. The second gate electrode 4200 may constitute the gate electrode of the switching transistor ST. The scan signal line 4300 may transfer the scan signal to the switching transistor ST through the second gate electrode 4200.

The storage capacitor second electrode 4400 may be disposed in the non-light emission area NEA to overlap the storage capacitor first electrode 1270. The storage capacitor second electrode 4400 and the storage capacitor first electrode 1270 may constitute the capacitor Cst of each pixel PX. Also, the storage capacitor second electrode 4400 may overlap one side or a side of the second semiconductor area 2200, and may be in contact with the second semiconductor area 2200 through the fourth contact hole CNT4.

The conductive line 4600 may be disposed at a lower side based on the center of the pixel PX and extended in the first direction DR1, and may be disposed in another pixel adjacent thereto in first direction DR1. The conductive line 4600 may overlap the second voltage line 1230, and may be in contact with the second voltage line 1230 through the fifth contact hole CNT5. The conductive line 4600 may overlap the second electrode 250, and may be in contact with the second electrode 250 through a sixth contact hole CNT6. Therefore, the second power voltage applied to the second voltage line 1230 may be transferred to the second electrode 250 through the conductive line 4600.

The first connection electrode 123 may serve as the source or drain electrode of the driving transistor DT. The first connection electrode 123 may be disposed in the non-light emission area NEA to overlap one side or a side of the first semiconductor area 2100, for example, one side or a side of the first active material layer 126 of the driving transistor DT, and may be disposed in the light emission area EMA to overlap the first contact electrode 361. The first connection electrode 123 may be in contact with a portion of the first semiconductor area 2100 through the eighth contact hole CNT8 that exposes a portion of the first semiconductor area 2100 by passing through the first insulating layer 520. The first connection electrode 123 may be in contact with a portion of the first contact electrode 361 through the seventh contact hole CNT7 that exposes a portion of the first contact electrode 361 by passing through the first insulating layer 520 (or gate insulating layer). Therefore, the driving transistor DT of the pixel PX may be electrically connected to the first contact electrode 361, the first electrode 240, and one end or an end of the light emitting element 300.

The second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer may be a single layer or a multi-layer. For example, the second conductive layer may be formed of a stacked structure such as Ti/Al/Ti, Mo/Al/Mo, Mo/AlGe/Mo, Ti/Cu, etc., within the spirit and the scope of the disclosure.

Hereinafter, the structure of the display device 10 will be described in detail with reference to other drawings.

Figure 4:
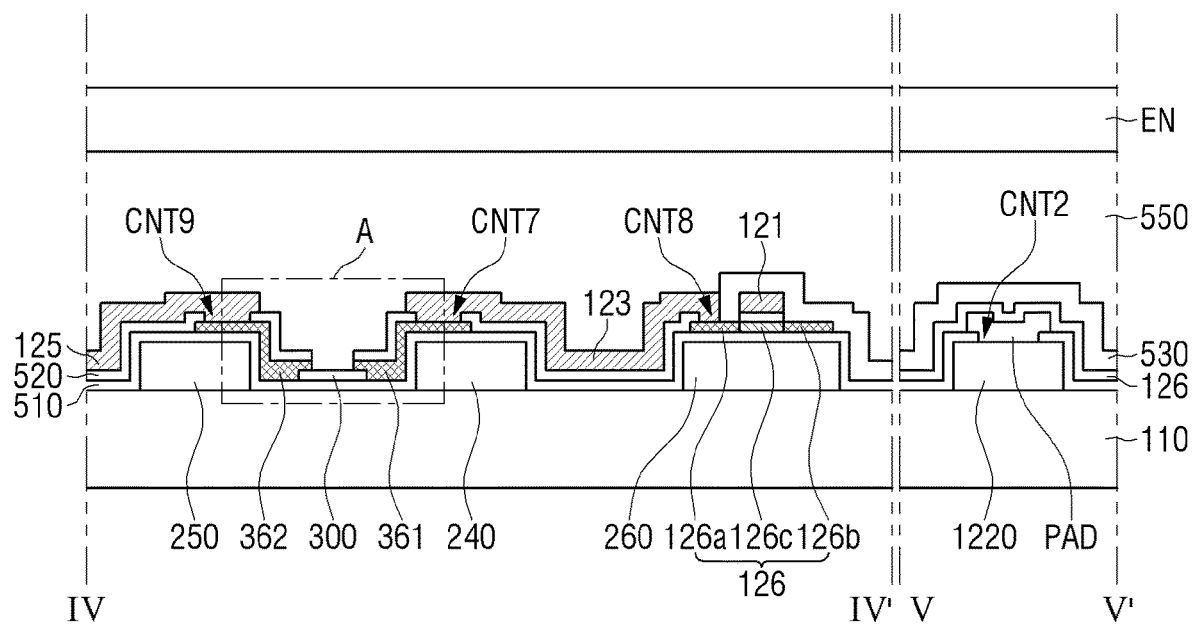
FIG. 4 is a schematic cross-sectional view taken along lines IV-IV' and V-V' of FIG. 3.
Figure 5:
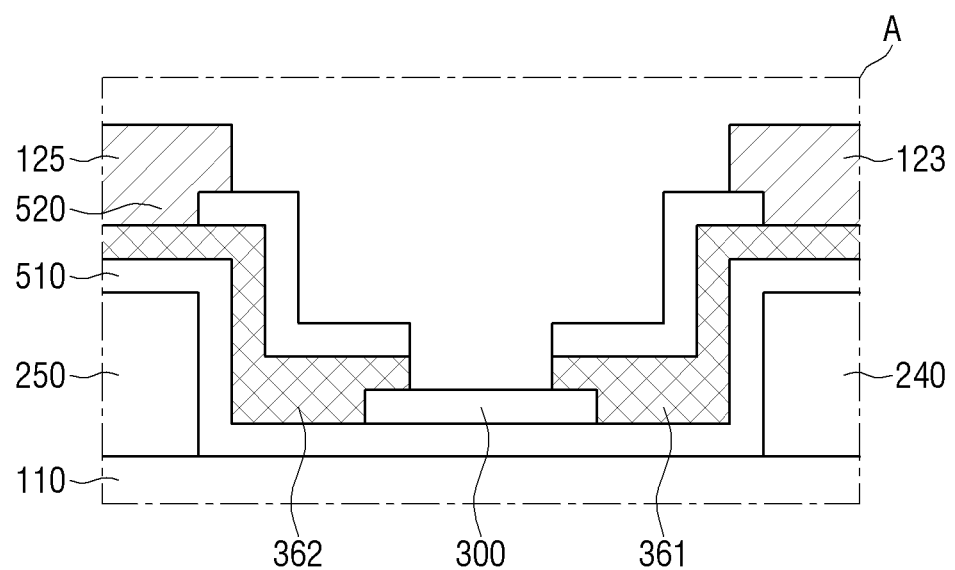
FIG. 5 is an enlarged schematic cross-sectional view illustrating an area A of FIG. 4.

FIG. 4 is a schematic cross-sectional view taken along lines IV-IV' and V-V' of FIG. 3. FIG. 5 is an enlarged schematic cross-sectional view illustrating an area A of FIG. 4.

FIG. 4 shows a cross-section of a portion of the members shown in FIG. 3 to illustrate the arrangement of the driving transistor DT, the first electrode 240, the second electrode 250 and the light emitting element 300 of each pixel PX. For example, FIG. 4 shows a cross-section across a portion of the first semiconductor area 2100 and both ends of one light emitting element 300 in the non-light emission area NEA. New reference numerals different from those of FIG. 3 are given to some of the members shown in FIG. 4 for convenience of description.

Referring to FIG. 4, the display device 10 may include a substrate 110, and a first electrode 240, a second electrode 250, a light emitting element 300, a first contact electrode 361, a second contact electrode 362 and a driving transistor DT, which are disposed on the substrate 110. The display device 10 may also include a buffer layer 510 and a first insulating layer 520 (or gate insulating layer), which are disposed on the substrate 110.

In detail, the substrate 110 may be an insulating substrate. The substrate 110 may be made of an insulating material such as glass, quartz, or a polymer resin. The substrate 110 may be a rigid substrate, but may be a flexible substrate capable of being subjected to bending, folding, rolling, or the like within the spirit and the scope of the disclosure.

The light shielding layer 260, the first electrode 240, and the second electrode 250 of the first conductive layer are disposed on the substrate 110.

The light shielding layer 260 may be disposed in the non-light emission area NEA, and the first electrode 240 and the second electrode 250 may be disposed in the light emission area EMA, respectively.

A thickness of the first electrode 240 and a thickness of the second electrode 250 as well as a thickness of the light shielding layer 260 may be greater than about 800 nm, respectively. Since each of the thickness of the first electrode 240 and the thickness of the second electrode 250 is designed to be greater than about 800 nm, upper surfaces of the first electrode 240 and the second electrode 250 may be positioned to be higher than a surface of the light emitting element 300. As a result, the first electrode 240 and the second electrode 250 may allow light emitted from the light emitting element 300 to move in an upper direction, and thus a bank (or bank layer) below the existing electrodes 240 and 250 may be omitted, whereby the process may be simplified.

In order that each of the thickness of the first electrode 240 and the thickness of the second electrode 250 is designed to be greater than about 800 nm, the first conductive layer may include titanium (Ti), copper (Cu), or a stacked structure of titanium and copper. In an embodiment in which the first conductive layer has a structure in which copper (Cu) and titanium (Ti) may be stacked each other, for example, copper (Cu) of each of the electrodes 240 and 250 may have a thickness of about 800 nm, and titanium (Ti) thereof may have a thickness of about 20 nm.

The electrodes 240 and 250 included in the first conductive layer may be disposed on or directly disposed on the upper surface of the substrate 110. In one embodiment, the entire lower surface of the first electrode 240 and the entire lower surface of the second electrode 250 may be directly in contact with (or, in contact with) the substrate 110.

In one embodiment, each of the electrodes 240 and 250 may have a uniform thickness. However, in an embodiment, each of sides of the electrodes 240 and 250 may have a shape inclined with respect to the extension direction of the light emitting element 300. For this reason, the light emitted from the light emitting element 300 may move in the upper direction.

The buffer layer 510 may be disposed on the first electrode 240, the second electrode 250 and the light shielding layer 260. The first active material layer 126 of the driving transistor DT may be disposed on the light shielding layer 260 with the buffer layer 510 interposed therebetween.

The buffer layer 510 may protect the first electrode 240 and the second electrode 250 and at the same time insulate the first electrode 240 and the second electrode 250 from each other. The buffer layer 510 may prevent the light emitting element 300 disposed thereon from being damaged by being directly in contact with other members, but the shape and structure of the buffer layer 510 are not limited thereto.

In one embodiment, the buffer layer 510 may cover all sides and upper surfaces of the respective electrodes 240 and 250 and the light shielding layer 260. For example, the buffer layer 510 may be directly in contact with (or, in contact with) all sides and upper surfaces of the respective electrodes 240 and 250 and the light shielding layer 260.

The light emitting element 300, the contact electrodes 361 and 362, and the first active material layer 126 of the driving transistor DT are disposed on the buffer layer 510.

The light emitting element 300 may be disposed on the buffer layer 510 between the electrodes 240 and 250, but is not limited thereto. Although not shown, at least a portion of the light emitting elements 300 disposed in the pixel PX may be disposed in an area other than an area between the respective electrodes 240 and 250. For example, the light emitting element 300 may not overlap each of the electrodes 240 and 250 in the thickness direction.

Layers may be disposed in the light emitting element 300 in a direction parallel with the substrate 110. The light emitting element 300 of the display device 10 according to one embodiment may have a shape extended in one direction or a direction, and may have a structure in which semiconductor layers are sequentially disposed in one direction or a direction. In the light emitting element 300, a first semiconductor layer 310, the active layer 330, a second semiconductor layer 320, and an electrode layer 370 may be sequentially disposed along one direction or a direction, and an insulating layer 380 may surround outer surfaces thereof. The light emitting element 300 disposed in the display device 10 may be disposed such that its extended one direction or a direction is parallel with the substrate 110, and the semiconductor layers included in the light emitting element 300 may be sequentially disposed along a direction parallel with the upper surface of the substrate 110, but the disclosure is not limited thereto. In case that the light emitting element 300 has another structure, the layers may be disposed in a direction perpendicular to the substrate 110. A detailed description of the structure of the light emitting element 300 will be made later with reference to other drawings.

One end or an end of the light emitting element 300 may be in contact with the first contact electrode 361, and the other end or another end thereof may be in contact with the second contact electrode 362. According to one embodiment, since the light emitting element 300 is exposed as an insulating layer 380 is not formed on an end surface of the extended one direction or a direction, the light emitting element 300 may be in contact with the first contact electrode 361 and the second contact electrode 362, which will be described later, in the exposed area, but is not limited thereto. In some cases, at least a portion of the insulating layer 380 may be removed, so that sides of both ends of the light emitting element 300 may be partially exposed. The exposed sides of the light emitting element 300 may be in contact with the first contact electrode 361 and the second contact electrode 362, but the disclosure is not limited thereto.

The first active material layer 126 of the driving transistor DT is disposed on the buffer layer 510 overlapping the light shielding layer 260. The first active material layer 126 may be an area that overlaps the light shielding layer 260 of the first semiconductor area 2100. The first active material layer 126 may include a first conductorization area 126a, a second conductorization area 126b, and a channel area 126c. The channel area 126c may be disposed between the first conductorization area 126a and the second conductorization area 126b. According to one embodiment, the first active material layer 126 may include an oxide semiconductor. The oxide semiconductor may be an oxide semiconductor containing indium (In). In an embodiment, the oxide semiconductor may be indium tin-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc., but is not limited thereto. The first conductorization area 126a and the second conductorization area 126b may be areas in which a portion of the first active material layer 126 is conductorized. Therefore, the first and second conductorization areas 126a and 126b may be source or drain areas of the first active material layer 126. In case that the first conductorization area 126a is a source area, the second conductorization area 126b may be a drain area, and in case that the first conductorization area 126a is a drain area, the second conductorization area 126b may be a source area, but the disclosure is not limited thereto.

The first active material layer 126 is not necessarily limited to the above description. In an embodiment, the first active material layer 126 may include polycrystalline silicon. The first conductorization area 126a may be a first doping area, and the second conductorization area 126b may be a second doping area. The polycrystalline silicon may be formed by crystallizing amorphous silicon. Examples of the crystallization method include, but are not limited to, a rapid thermal annealing (RTA) method, a solid phase crystallization (SPC) method, an excimer laser annealing (ELA) method, a metal induced crystallization (MILC) method, and a sequential lateral solidification (SLS) method. As another example, the first active material layer 126 may include monocrystalline silicon, low temperature polycrystalline silicon, amorphous silicon, and the like within the spirit and the scope of the disclosure.

The first active material layer 126 or the first semiconductor area 2100 may be electrically connected to the first voltage line 1220. A pad electrode PAD may be disposed on the first voltage line 1220 exposed through the second contact hole CNT2, and the first active material layer 126 of the driving transistor DT may be in contact with the pad electrode PAD. Therefore, the driving transistor DT may be electrically connected to the first voltage line 1220.

A gate insulating layer 150, and a gate electrode 121 of the driving transistor DT are disposed on the first active material layer 126. The gate electrode 121 may overlap the channel area 126c of the first active material layer 126 with the gate insulating layer 150 interposed therebetween. As described above, the gate electrode 121 may be the first gate electrode 4100.

The contact electrodes 361 and 362 are disposed on the first electrode 240 and the second electrode 250. The first contact electrode 361 is disposed on the first electrode 240, and the second contact electrode 362 is disposed on the second electrode 250. A portion of the contact electrodes 361 and 362 is disposed on the buffer layer 510. The first contact electrode 361 may be in contact with the exposed area of the first electrode 240, and the second contact electrode 362 may be in contact with the exposed area of the second electrode 250. As described above, the first contact electrode 361 and the second contact electrode 362 may be in contact with at least one end or an end of the light emitting element 300, and may be electrically connected to the first electrode 240 or the second electrode 250 to receive an electrical signal. The first contact electrode 361 and the second contact electrode 362 may be spaced apart from each other.

A first insulating layer 520 (or gate insulating layer) is disposed on the contact electrodes 361 and 362, and the gate electrode 121 of the driving transistor DT. The first insulating layer 520 may be disposed entirely on the substrate 110, and may be disposed to cover the contact electrodes 361 and 362, the gate electrode 121 of the driving transistor DT, and the light emitting element 300. As described above, the first insulating layer 520 may include the seventh contact hole CNT7 exposing a portion of the first contact electrode 361 by passing through the first insulating layer 520, the ninth contact hole CNT9 exposing a portion of the second contact electrode 362 by passing through the first insulating layer 520, and the eighth contact hole CNT8 exposing one side or a side of the first active material layer 126. The first connection electrode 123 of the driving transistor DT may be disposed on the first insulating layer 520, and may be in contact with the first contact electrode 361 and the first doping area 126a, which is one side or a side of the first active material layer 126, through the contact holes CNT7 and CNT8. The second connection electrode 125 may be disposed on the first insulating layer 520, and may be in contact with the second contact electrode 362 through the contact hole CNT9. Although not shown, the second connection electrode 125 may be electrically connected to the second electrode 250.

In the light emission area EMA, an inner end of the first insulating layer 520 on the first contact electrode 361 may be aligned with an inner end of the first contact electrode 361 in the thickness direction, and an inner end of the first insulating layer 520 on the second contact electrode 362 may be aligned with the inner end of the second contact electrode 362 in the thickness direction. This is because that, as will be described later in the manufacturing method of the display device, an etching process of forming the contact electrodes 361 and 362 from the first conductive layer is performed through insulating patterns of the first insulating layer 520, which are separated from each other on the respective contact electrodes 361 and 362. The etching process of forming the contact electrodes 361 and 362 from the first conductive layer may be performed simultaneously with an etching process of forming the connection electrodes 123 and 125 and the gate electrode 121 from the second conductive layer.

A passivation layer 550 may be disposed on the first insulating layer 520, and the first connection electrode 123 of the driving transistor DT. The passivation layer 550 may serve to protect members disposed on the substrate 110 against an external environment.

Each of the buffer layer 510, the first insulating layer 520 and the passivation layer 550 may include an inorganic insulating material or an organic insulating material. In an embodiment, each of the buffer layer 510, the first insulating layer 520 and the passivation layer 550 may include an inorganic insulating material such as silicon oxide ($SiO_x$), silicon nitride ($SiN_x$), silicon oxynitride ($SiO_xN_y$), aluminum oxide ($Al_2O_3$) and aluminum nitride (AlN). Each of the buffer layer 510, the first insulating layer 520 and the passivation layer 550 may include an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethylmethacrylate, polycarbonate, or a polymethyl methacrylate-polycarbonate synthetic resin as an organic insulating material, but is not limited thereto.

An encapsulation layer EN may be disposed on the passivation layer 550. In an embodiment, the encapsulation layer EN may be a thin film encapsulation layer that may include at least one encapsulation film. For example, the encapsulation layer EN may include a first inorganic layer, an organic layer, and a second inorganic layer. Each of the first inorganic layer and the second inorganic layer may include silicon nitride, silicon oxide, or silicon oxynitride. The organic layer may include an organic insulating material such as an acrylic resin (polyacrylates resin), an epoxy resin, a phenolic resin, a polyamide resin, a polyimide resin, an unsaturated polyester resin, a poly phenylenethers resin, a polyphenylenesulfides resin, or benzocyclobutene (BCB).

Figure 6:
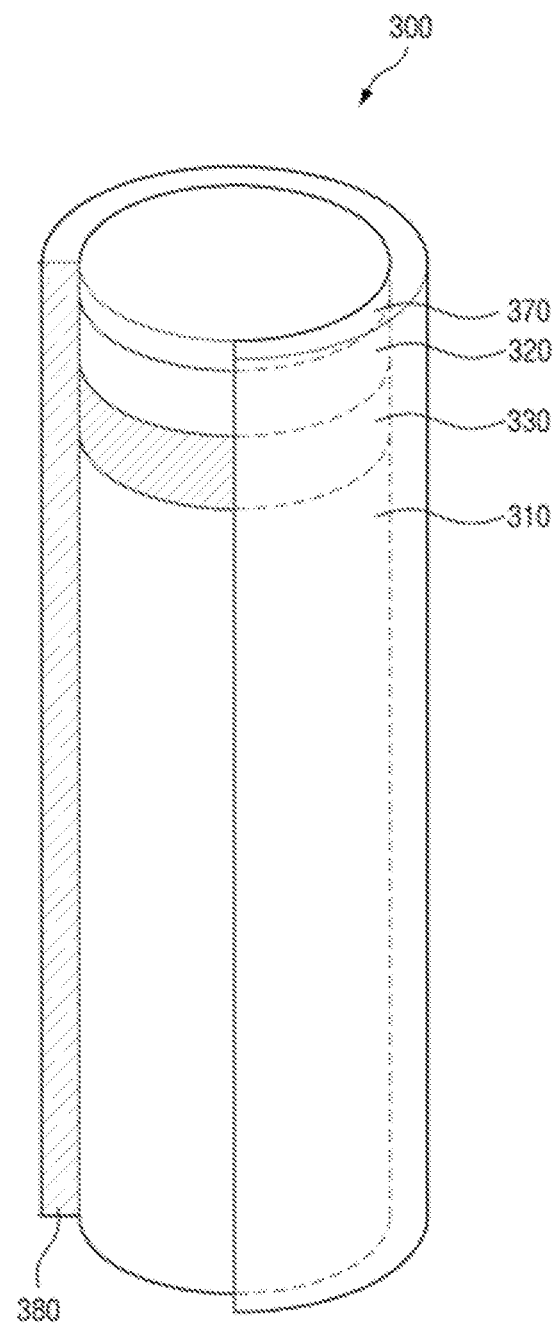
FIG. 6 is a schematic view illustrating a light emitting element according to one embodiment.

FIG. 6 is a schematic view illustrating a light emitting element according to one embodiment.

The light emitting element 300 may be a light emitting diode, and by way of example, the light emitting element 300 may be an inorganic light emitting diode made of an inorganic material with a size of a micro-meter to a nano-meter. The light emitting element 300 may be aligned between two electrodes having polarities in case that an electric field is formed in a given direction between the two electrodes facing each other.

The light emitting element 300 according to one embodiment may have a shape extended in one direction or a direction. The light emitting element 300 may have a shape such as a rod, a wire and a tube. In an embodiment, the light emitting element 300 may have a cylindrical shape or a rod shape, but is not limited thereto. The light emitting element 300 may have a polygonal pillar shape such as a cube, a cuboid and a hexagonal pillar, or may have various shapes such as a shape extended in one direction or a direction, having an outer surface that is partially inclined. semiconductors, which will be described later and are included in the light emitting element 300, may be sequentially disposed or stacked along one direction or a direction.

The light emitting element 300 may include a semiconductor layer doped with any conductivity type (for example, p-type or n-type) dopants. The semiconductor layer may emit light of a given wavelength band as an electrical signal applied from an external power source is transferred thereto.

The light emitting element 300 according to one embodiment may emit light of a given wavelength band. In an embodiment, the active layer 330 may emit blue light having a central wavelength band ranging from about 450 nm to about 495 nm. However, the central wavelength band of blue light is not limited to the above-described range, and it should be understood that the central wavelength band of blue light may include all wavelength ranges that may be recognized as blue in the art. Light emitted from the active layer 330 of the light emitting element 300 is not limited to blue light, and may be green light having a central wavelength band ranging from about 495 nm to about 570 nm or red light having a central wavelength band ranging from about 620 nm to about 750 nm. Hereinafter, the light emitting device 300 emitting blue light will be described as an example.

Referring to FIG. 5, the light emitting element 300 may include a semiconductor core and an insulating layer 380 surrounding the semiconductor core. The semiconductor core of the light emitting element 300 may include a first semiconductor layer 310, a second semiconductor layer 320, and an active layer 330. The light emitting element 300 according to one embodiment may further include an electrode layer 370 disposed on one surface or a surface of the first semiconductor layer 310 or the second semiconductor layer 320.

The first semiconductor layer 310 may be an n-type semiconductor. For example, in case that the light emitting element 300 emits light of a blue wavelength band, the first semiconductor layer 310 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 310 may be any one or more of AlGaInN, GaN, AlGaN, InGaN, AlN and InN, which are doped with n-type dopants. The first semiconductor layer 310 may be doped with n-type dopants, and the n-type dopants may be Si, Ge, Sn, etc., for example. In an embodiment, the first semiconductor layer 310 may be n-GaN doped with n-type Si. The first semiconductor layer 310 may have a length ranging from about 1.5 μm to about 5 μm, but is not limited thereto.

The second semiconductor layer 320 is disposed on the active layer 330 that will be described later. The second semiconductor layer 320 may be a p-type semiconductor, and in case that the light emitting element 300 emits light of a blue or green wavelength band, the second semiconductor layer 320 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 320 may be any one or more of AlGaInN, GaN, AlGaN, InGaN, AlN and InN, which are doped with p-type dopants, and the p-type dopants may be Mg, Zn, Ca, Se, Ba, etc., for example. In an embodiment, the second semiconductor layer 320 may be p-GaN doped with p-type Mg. The second semiconductor layer 320 may have a length ranging from about 0.05 μm to about 0.10 μm, but is not limited thereto.

The first semiconductor layer 310 and the second semiconductor layer 320 are shown as being formed of a single layer, but are not limited thereto. According to an embodiment, the first semiconductor layer 310 and the second semiconductor layer 320 may further include a larger number of layers, such as a clad layer or a tensile strain barrier reducing (TSBR) layer, depending on the material of the active layer 330. The description of the first semiconductor layer 310 and the second semiconductor layer 320 will be made later with reference to other drawings.

The active layer 330 is disposed between the first semiconductor layer 310 and the second semiconductor layer 320. The active layer 330 may include a material of a single or multiple quantum well structure. In case that the active layer 330 may include a material of a multiple quantum well structure, quantum layers and well layers may be alternately stacked each other. The active layer 330 may emit light by combination of electron-hole pairs in accordance with electrical signals applied through the first semiconductor layer 310 and the second semiconductor layer 320. For example, in case that the active layer 330 emits light of a blue wavelength band, the active layer 330 may include a material such as AlGaN and AlGaInN. For example, in case that the active layer 330 has a stacked structure of quantum layers and well layers, which may be alternately stacked each other in a multiple quantum well structure, the quantum layer may include a material such as AlGaN or AlGaInN, and the well layer may include a material such as GaN or AlInN. In an embodiment, the active layer 330 may include AlGaInN as the quantum layer and include AlInN as the well layer to emit blue light having a central wavelength band ranging from about 450 nm to about 495 nm, as described above.

However, the active layer 330 is not limited to the above example. The active layer 330 may have a structure in which a semiconductor material having a big band gap energy and semiconductor materials having a small band gap energy may be alternately stacked each other, and may include group-III or group-V semiconductor materials depending on a wavelength band of light that is emitted. The active layer 330 may emit light of a red or green wavelength band, as the case may be, without limitation to light of a blue wavelength band. The active layer 330 may have a length ranging from about 0.05 μm to about 0.10 μm, but is not limited thereto.

The light emitted from the active layer 330 may be emitted to both sides as well as an outer surface of the light emitting element 300 in a longitudinal direction. Directionality of the light emitted from the active layer 330 is not limited to one direction or a direction.

The electrode layer 370 may be an ohmic contact electrode, but is not limited thereto. The electrode layer 370 may be a Schottky contact electrode. The light emitting element 300 may include at least one electrode layer 370. Although FIG. 5 shows that the light emitting element 300 may include one electrode layer 370, the disclosure is not limited thereto. As the case may be, the light emitting element 300 may include a larger number of electrode layers 370, or the electrode layer 370 may be omitted. The description of the light emitting element 300, which will be made later, may be equally applied to even the case that the number of electrode layers 370 is changed or the light emitting element 300 further may include another structure.

The electrode layer 370 may reduce resistance between the light emitting element 300 and an electrode or a contact electrode in case that the light emitting element 300 is electrically connected with the electrode or the contact electrode in the display device 10. The electrode layer 370 may include a metal having conductivity. For example, the electrode layer 370 may include at least one of Al, Ti, In, Au, Ag, ITO, IZO or ITZO. The electrode layer 370 may include a semiconductor material doped with n-type or p-type. The electrode layers 370 may include a same material or a similar material, or may include different materials. The electrode layer 370 may have a length ranging from about 0.02 μm to about 0.01 μm, but is not limited thereto.

The insulating layer 380 is disposed to surround a portion of outer surfaces of the above-described semiconductor core and electrode layer 370. In an embodiment, the insulating layer 380 may be disposed to surround at least an outer surface of the active layer 330, and may be extended in one direction or a direction in which the light emitting element 300 is extended. The insulating layer 380 may serve to protect the above members. For example, the insulating layer 380 may be formed to expose both ends in a longitudinal direction of the light emitting element 300 while surrounding side portions of the above members.

Although the insulating layer 380 is shown as being extended in the longitudinal direction of the light emitting element 300 and formed to cover the side of the electrode layer 370 from a main body of the first semiconductor layer 310, the insulating layer 380 is not limited thereto. The insulating layer 380 may include the active layer 330 to cover only an outer surface of some of the semiconductor layer or a portion of an outer surface of the electrode layer 370, thereby partially exposing the outer surface of each electrode layer 370. Also, the insulating layer 380 may be formed with a rounded upper surface on a section in an area adjacent to at least one end or an end of the light emitting element 300.

The insulating layer 380 may include materials having insulation property, for example, silicon oxide ($SiO_x$), silicon nitride ($SiN_x$), silicon oxynitride ($SiO_xN_y$), aluminum nitride (AlN), aluminum oxide ($Al_2O_3$), etc., within the spirit and the scope of the disclosure. Therefore, the insulating layer 380 may prevent an electrical short that may occur in the light emitting element 300 in case that the light emitting element 300 is directly in contact with (or, in contact with) the electrode to which the electrical signal is transferred. Also, since the insulating layer 380 may include the active layer 330 to protect the outer surface of the light emitting element 300, the insulating layer 380 may prevent light emitting efficiency from being deteriorated.

In an embodiment, the outer surface of the insulating layer 380 may be surface-treated. The light emitting element 300 may be aligned by being sprayed onto the electrode in a state that it is dispersed in an ink in case that the display device 10 is manufactured. The surface of the insulating layer 380 may be hydrophobic-treated or hydrophilic-treated, so that the light emitting element 300 may be maintained to be dispersed in the ink without being condensed with another light emitting element 300 adjacent thereto.

The insulating layer 380 may include at least the active layer 330 to protect the semiconductor core of the light emitting element 300. As described above, the insulating layer 380 may be partially etched and thus thinned during the manufacturing process of the light emitting element 300 and the manufacturing process of the display device 10. In case that the insulating layer 380 has a thin thickness, the insulating layer 380 may be removed by being etched during the manufacturing process, or the semiconductor core, especially the active layer 330 may be damaged. To prevent this, the insulating layer 380 of the light emitting element 300 according to one embodiment may have a thickness of a given level or more. In an embodiment, the insulating layer 380 may have a thickness ranging from about 10 nm to about 1.0 μm, but is not limited thereto. By way of non-limiting example, the thickness of the insulating layer 380 may be about 40 nm.

The light emitting element 300 may have a length ranging from about 1 μm to about 10 μm or about 2 μm to about 6 μm, and for example may have a length ranging from about 3 μm to about 5 μm. The light emitting element 300 may have a diameter ranging from about 300 nm to about 700 nm, and an aspect ratio of the light emitting element 300 may be about 1.2 to about 100. However, the disclosure is not limited to the above example, and the light emitting elements 300 included in the display device 10 may have their respective diameters different from each other depending on a composition difference of the active layer 330. By way of example, the diameter of the light emitting element 300 may be in the range of about 600 nm.

The display device 10 according to one embodiment may include a light emission area EMA and a non-light emission area NEA for each pixel PX, wherein a light emitting element 300 is disposed in the light emission area EMA, and circuit elements, for example, a driving transistor DT and a switching transistor ST are disposed in the non-light emission area NEA. Since the driving transistor DT is disposed above the light emitting element 300 so as not to overlap the light emitting element 300, light emitted from the light emitting element 300 may move in an upper or lower direction of the substrate 110. Therefore, the display device 10 may have a front light emitting structure or a rear light emitting structure depending on the direction of light emitted from the light emitting element 300.

In the display device 10, the contact electrodes 361 and 362, and the first active material layer 126 of the driving transistor DT are disposed on the buffer layer 510, respectively. For example, the first active material layer 126 of the driving transistor DT may be disposed on a same layer as the contact electrodes 361 and 362. In an embodiment, the contact electrodes 361 and 362 may include a same material or a similar material as that of the first active material layer 126, which may be generated by a same process during the manufacturing process of the display device 10. Therefore, the manufacturing process of the display device 10 may be shortened. This will be described with reference to other embodiments.

Hereinafter, the manufacturing process of the display device 10 will be described with reference to other drawings.

FIGS. 7 to 13 are schematic cross-sectional views illustrating process steps of a method for manufacturing a display device according to one embodiment.

The manufacturing process of the display device 10 will be described with reference to FIGS. 3, 4 and 7 to 14.

Figure 7:
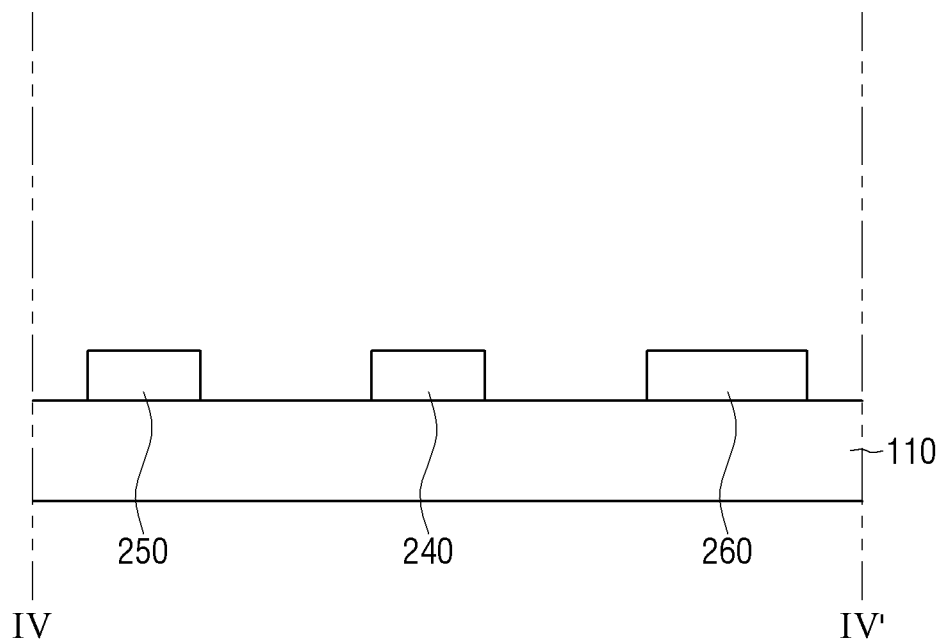
FIGS. 7 to 13 are schematic cross-sectional views illustrating process steps of a method for manufacturing a display device according to one embodiment.

Referring to FIGS. 3, 4 and 7, the first electrode 240 and the second electrode 250, which are spaced apart from each other, are disposed on the substrate 110 in which a light emission area EMA and a non-light emission area NEA are defined. In the corresponding process, other electrodes including the light shielding layer 260 of the first conductive layer described in FIG. 4 may be further disposed.

The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single layer or a multi-layer. For example, the first conductive layer may be formed of a stacked structure such as Ti/Al/Ti, Mo/Al/Mo, Mo/AlGe/Mo and Ti/Cu.

Each of the thickness of the first electrode 240 and the thickness of the second electrode 250 may be greater than about 800 nm. Since each of the thickness of the first electrode 240 and the thickness of the second electrode 250 is designed to be greater than about 800 nm, the upper surfaces of the first electrode 240 and the second electrode 250 may be positioned to be higher than the surface of the light emitting element 300. As a result, since the first electrode 240 and the second electrode 250 may allow the light emitted from the light emitting element 300 to move toward the upper direction, the existing bank (or bank layer) below the electrodes 240 and 250 may be omitted, whereby the process may be simplified.

In order that each of the thickness of the first electrode 240 and the thickness of the second electrode 250 is designed to be greater than about 800 nm, the first conductive layer may include titanium (Ti), copper (Cu), or a stacked structure of titanium and copper. The electrodes 240 and 250 included in the first conductive layer may be disposed on or directly disposed on the upper surface of the substrate 110. In one embodiment, the entire lower surface of the first electrode 240 and the entire lower surface of the second electrode 250 may be directly in contact with (or, in contact with) the substrate 110.

In one embodiment, the electrodes 240 and 250 may have a uniform thickness. However, in an embodiment, the sides of the electrodes 240 and 250 may have a shape inclined with respect to the extension direction of the light emitting element 300. As a result, the light emitted from the light emitting element 300 may move in the upper direction.

Figure 8:
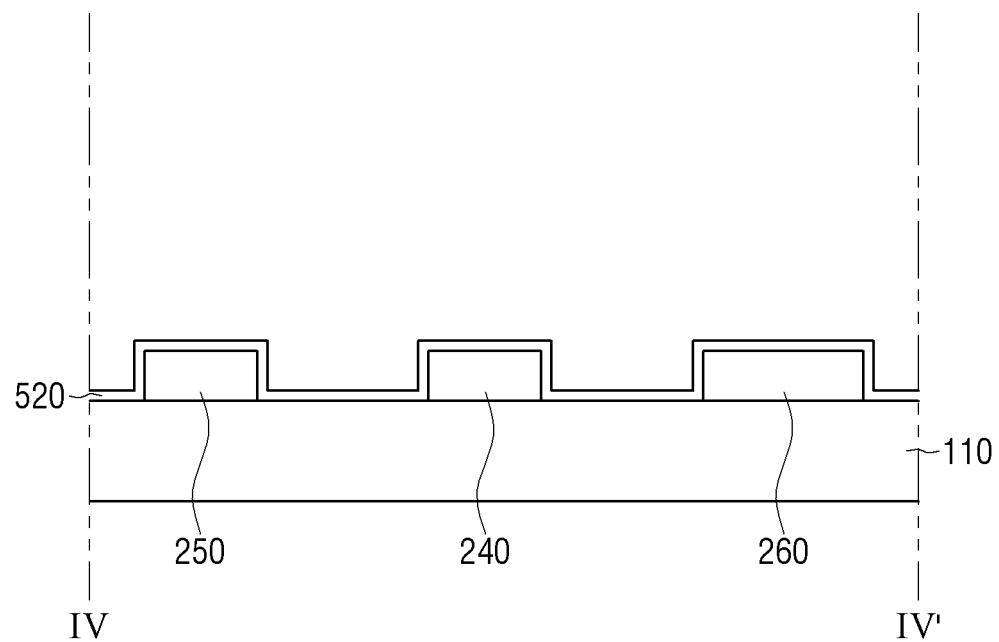

Referring to FIGS. 3, 4 and 8, the buffer layer 510 is disposed on the first electrode 240, the second electrode 250, and the light shielding layer 260. In one embodiment, the buffer layer 510 may be disposed to cover all sides and upper surfaces of each of the electrodes 240 and 250 and the light shielding layer 260.

Figure 9:
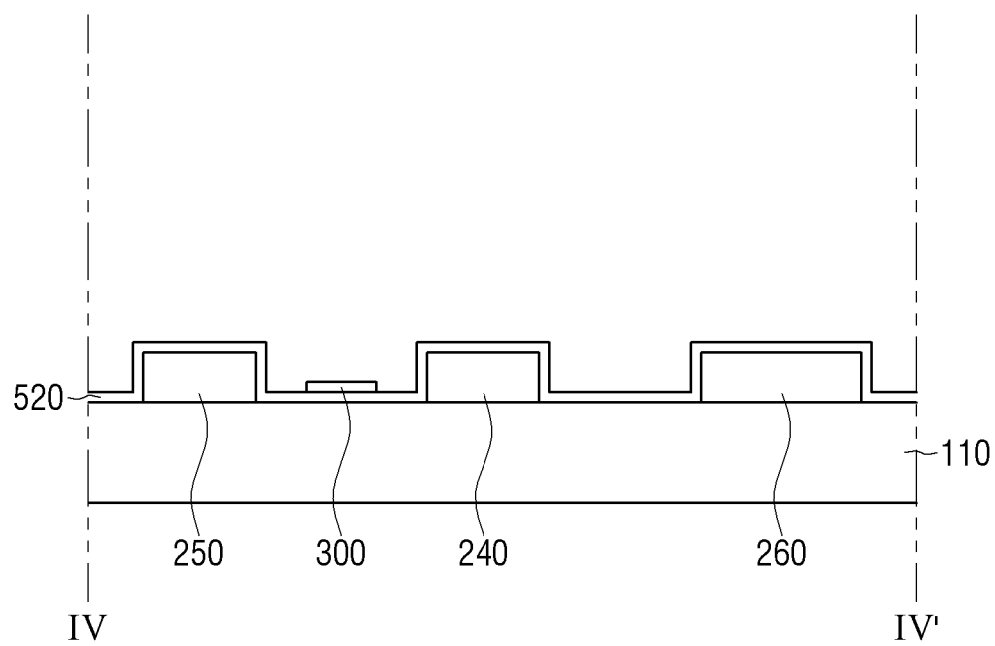

Referring to FIGS. 3, 4 and 9, the light emitting element 300 is disposed.

The light emitting element 300 may be disposed on the buffer layer 510 between the electrodes 240 and 250, but is not limited thereto. Although not shown, at least a portion of the light emitting elements 300 disposed in the pixel PX may be disposed in an area other than an area between the respective electrodes 240 and 250. For example, the light emitting element 300 may not overlap each of the electrodes 240 and 250 in the thickness direction.

In the light emitting element 300, layers may be disposed in a direction parallel with the substrate 110. The light emitting element 300 of the display device 10 according to one embodiment may have a structure extended in one direction or a direction, and may have a structure in which semiconductor layers may be sequentially disposed in one direction or a direction. In the light emitting element 300, the first semiconductor layer 310, the active layer 330, the second semiconductor layer 320 and the electrode layer 370 may be sequentially disposed along one direction or a direction, and the insulating layer 380 may surround outer surfaces of these layers. The light emitting element 300 disposed in the display device 10 may be disposed such that its extended one direction or a direction is parallel with the substrate 110, and the semiconductor layers included in the light emitting element 300 may be sequentially disposed along the direction parallel with the upper surface of the substrate 110, but the disclosure is not limited thereto. In case that the light emitting element 300 has another structure, the layers may be disposed in a direction perpendicular to the substrate 110.

Figure 10:
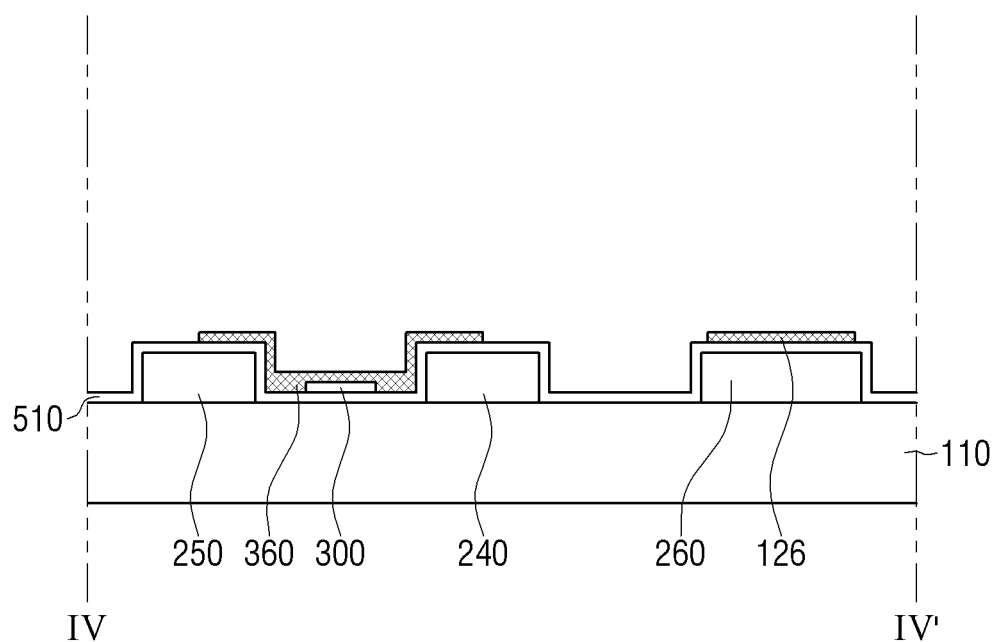

Referring to FIGS. 3, 4 and 10, the first active material layer 126 and a contact electrode layer 360 are formed. The contact electrode layer 360 and the first active material layer 126 of the driving transistor DT may be disposed in substantially the same layer, and the contact electrode layer 360 and the first active material layer 126 may include a same material or a similar material. The first active material layer 126 may include an oxide semiconductor. The oxide semiconductor may be an oxide semiconductor containing indium (In). In an embodiment, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc., within the spirit and the scope of the disclosure. The contact electrode layer 360 may cover the entire upper surface of the light emitting element 300.

Figure 11:
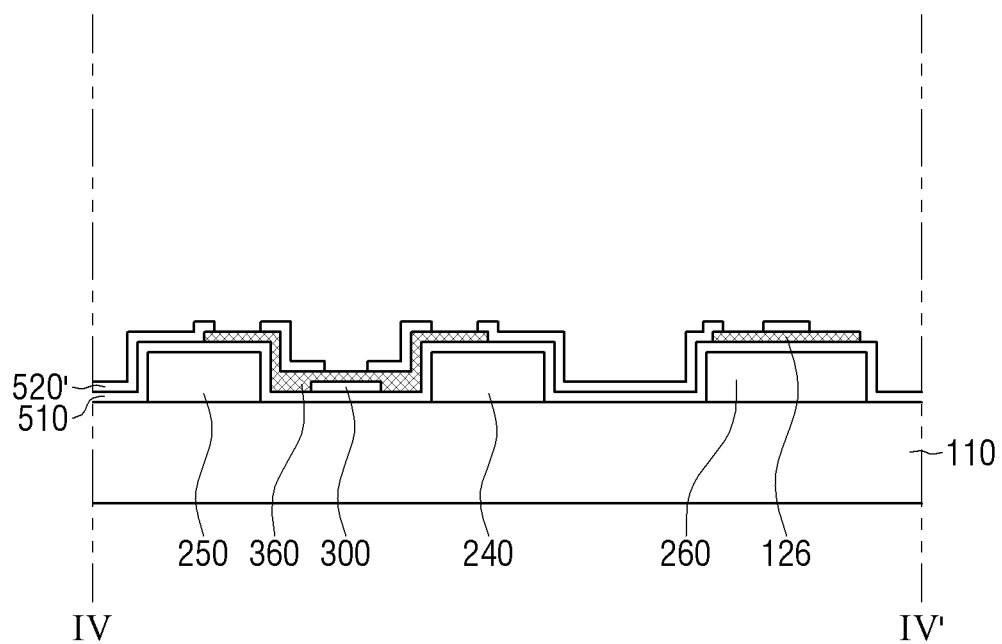

Referring to FIGS. 3, 4 and 11, the first insulating layer 520 (520' of FIG. 11) is formed. The first insulating layer 520 is disposed entirely on the contact electrode layer 360 to cover the contact electrode layer 360, and the contact holes CNT7, CNT8 and CNT9 described in FIG. 4 and an open hole may be formed.

Figure 12:
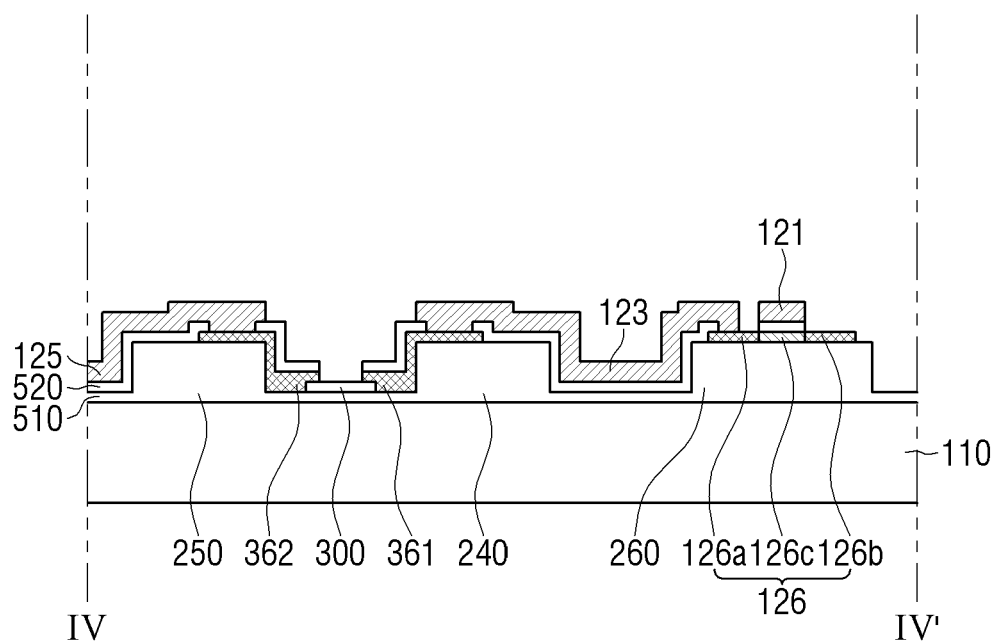

Referring to FIGS. 3, 4 and 12, the second conductive layer is formed on the first insulating layer 520. As shown in FIG. 12, the second conductive layer may include the connection electrodes 123 and 125 and the gate electrode 121. The second conductive layer is entirely deposited on the first insulating layer 520, and the connection electrodes 123 and 125 and the gate electrode 121 that are physically separated from each other through a mask process may be formed. As described above, the etching process of forming the contact electrodes 361 and 362 from the first conductive layer may be performed simultaneously with the etching process of forming the connection electrodes 123 and 125 and the gate electrode 121 from the second conductive layer.

Figure 13:
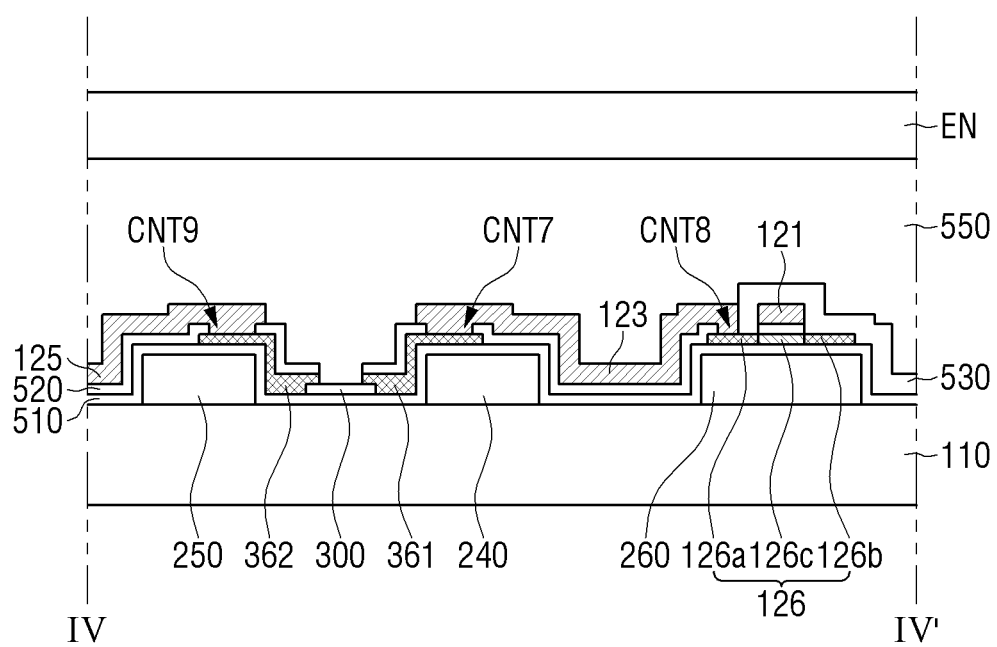

Referring to FIGS. 3, 4 and 13, the second insulating layer 530 is formed, which is directly in contact with (or, in contact with) the upper surface of the first active material layer 126, which is exposed by the first insulating layer 520, the side of the first insulating layer 520, which overlaps the first active material layer 126, and the side and upper surface of the gate electrode 121. The passivation layer 550 is formed on the connection electrodes 123 and 125 and the second insulating layer 530, and the encapsulation layer EN is formed on the passivation layer 550.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
 a light emission area and a non-light emission area;
 a first electrode and a second electrode spaced apart from each other on a substrate in the light emission area;
 a buffer layer disposed in the light emission area and the non-light emission area on the substrate and covering the first electrode and the second electrode;
 a light emitting element disposed between the first electrode and the second electrode;
 a first contact electrode disposed on the first electrode electrically contacting an end of the light emitting element, and a second contact electrode disposed on the second electrode electrically contacting another end of the light emitting element; and an active layer disposed on the buffer layer, a first insulating layer disposed on an active material layer, a gate electrode disposed on the first insulating layer and overlapping the active material layer in a thickness direction, and a first connection electrode electrically contacting at least one side of the active material layer, in the non-light emission area, wherein the first contact electrode, the second contact electrode, and the active material layer are disposed on a same first layer, and each of a thickness of the first electrode and a thickness of the second electrode is greater than about 800 nm.

2. The display device of claim 1, wherein the active material layer is electrically connected to the first contact electrode.

3. The display device of claim 2, wherein each of the active material layer, the first contact electrode and the second contact electrode includes an oxide semiconductor.

4. The display device of claim 3, wherein
the active material layer includes a first conductorization area, a second conductorization area, and a channel area disposed between the first conductorization area and the second conductorization area, and the first contact electrode, the second contact electrode, and the first conductorization area include a same material.

5. The display device of claim 4, wherein the light emitting element does not overlap at least the active material layer in the thickness direction.

6. The display device of claim 2, further comprising:
a light shielding layer overlapping the active material layer and disposed between the buffer layer and the substrate.

7. The display device of claim 6, wherein the light shielding layer, the first electrode and the second electrode are disposed on a same second layer.

8. The display device of claim 7, wherein the light shielding layer and each of the first electrode and the second electrode include a same material.

9. The display device of claim 2, wherein each of the first electrode and the second electrode directly contacts the substrate.

10. The display device of claim 9, wherein each of an entire lower surface of the first electrode and an entire lower surface of the second electrode directly contacts the substrate.

11. The display device of claim 2, wherein a second insulating layer is disposed on the first insulating layer, the first contact electrode, and the second contact electrode in the light emission area.

12. The display device of claim 11, wherein the second insulating layer partially exposes an upper surface of the first contact electrode and an upper surface of the second contact electrode.

13. The display device of claim 12, wherein
an inner end of the first insulating layer on the first contact electrode is aligned with an inner end of the first contact electrode in the thickness direction in the light emission area, and an inner end of the first insulating layer on the second contact electrode is aligned with an inner end of the second contact electrode in the thickness direction in the light emission area.

14. The display device of claim 13, wherein
the first connection electrode and the gate electrode include a same material, and the first connection electrode directly contacts the exposed upper surface of the first contact electrode.

15. The display device of claim 2, wherein the light emitting element does not overlap each of the first electrode and the second electrode in the thickness direction.

16. The display device of claim 2, wherein each of the first electrode and the second electrode has a uniform thickness.

17. A method of manufacturing a display device, the method comprising:
disposing a first electrode and a second electrode spaced apart from each other in a light emission area on a substrate, the display device including the light emission area and a non-light emission area;

disposing a buffer layer covering the first electrode and the second electrode on the substrate;

disposing a light emitting element between the first electrode and the second electrode;

disposing a first contact electrode electrically contacting an end of the light emitting element on the first electrode, and a second contact electrode electrically contacting another end of the light emitting element on the second electrode in the light emission area and disposing an active material layer in the non-light emission area;

disposing a first insulating layer on the buffer layer, the first contact electrode and the second contact electrode in the light emission area and on the active material layer in the non-light emission area; and disposing a gate electrode overlapping in a thickness direction the active material layer and a first connection electrode electrically contacting at least one side of the active material layer, the first contact electrode, the second contact electrode, and the active material layer are formed on a same layer, and each of a thickness of the first electrode and a thickness of the second electrode is greater than about 800 nm.

18. The method of claim 17, wherein
the active material layer is electrically connected to the first contact electrode, and each of the active material layer, the first contact electrode and the second contact electrode includes an oxide semiconductor.

19. The method of claim 18, wherein
the active material layer includes a first conductorization area, a second conductorization area, and a channel area disposed between the first conductorization area and the second conductorization area, and each of the first contact electrode and the second contact electrode and the first conductorization area include a same material.

20. The method of claim 17, wherein
the disposing of the first electrode and the second electrode includes disposing a light shielding layer disposed between the buffer layer and the substrate, and the active material layer overlaps the light shielding layer in the thickness direction.

* * * * *